(12) United States Patent
Simburger et al.

(10) Patent No.: US 6,300,158 B1
(45) Date of Patent: Oct. 9, 2001

(54) INTEGRATED SOLAR POWER MODULE

(75) Inventors: Edward J. Simburger, Agoura; James H. Matsumoto, Los Angeles; Thomas W. Giants, Santa Monica; Alec Garcia, III, Santa Clarita, all of CA (US); Frank R. Jeffrey, Ames, IA (US); Paul A. Gierow, Madison, AL (US)

(73) Assignees: Iowa Thin Films, Boone, IA (US); The Aerospace Corporation, El Segundo, CA (US); SRS Technologies, Huntsville, AL (US)

( * ) Notice: Subject to any disclaimer, the term of this patent is extended or adjusted under 35 U.S.C. 154(b) by 0 days.

(21) Appl. No.: 09/649,726

(22) Filed: Aug. 28, 2000

(51) Int. Cl.[7] .................................................... H01L 21/00
(52) U.S. Cl. ............................................................ 438/59
(58) Field of Search ................... 438/59–61, 52, 438/57, 58, 800; 29/846

(56) References Cited

U.S. PATENT DOCUMENTS 5,540,742 * 7/1996 Sangyoji et al. .................... 29/623.5

* cited by examiner

Primary Examiner—Charles Bowers
Assistant Examiner—Craig Thompson
(74) Attorney, Agent, or Firm—Derrick Michael Reid

(57) ABSTRACT

Multiple layers of a clear insulating material, such as clear polyimide, with horizontal metalization layers therebetween and with vertical feed through metal traces therethrough form a flexible three dimension circuit printed circuit board upon which semiconductor devices, such as thin film solar cell can be directly deposited for forming a flexible electronic module, and upon which electronic discrete component can be bonded and electrically connected. In one exemplar configuration, a flexible thin film solar cell power module has thin film solar cells deposited on one side and power converters bonded on the other for a solar array power system. The flexible printed circuit board is well suited for forming electronic systems about a curved surface such as a power sphere nanosatellite.

8 Claims, 2 Drawing Sheets

THIN FILM PROCESS MANUFACTURE

THERMAL EMMISIVE THIN FILM SOLAR CELL

INTEGRATED SOLAR POWER MODULE

THIN FILM PROCESS MANUFACTURE

INTEGRATED SOLAR POWER MODULE

REFERENCE TO RELATED APPLICATION

The present application is related to applicant's copending application entitled "Flexible Thin Film Solar Cell" Ser. No. 09/649,194 filed Aug. 28, 2000.

The present application is related to applicant's copending application entitled "Power Sphere Nanosatellite" Ser. No. 09/520,120 filed Mar. 6, 2000.

The present application is related to applicant's copending application entitled "Power Distribution System" Ser. No. 08/281,653, filed Mar. 30, 1999.

FIELD OF THE INVENTION

The present inventions relate to the field of thin film devices and processes. More particularly, the present inventions relate to thin film solar cells and thin film flexible circuit boards, and methods of manufacturing the same.

BACKGROUND OF THE INVENTION

There has been recently interest in the conceptual designs for microsatellites and nanosatellites for various space missions deployed, for example, in low earth orbits. These microsatellites and nanosatellites require the collection of sufficient power for onboard instruments. These microsatellites and nanosatellites are typically low in weight and low in volume and have a limited amount of surface area for power collection. Because the overall surface area of a microsatellite or nanosatellite is small, body-mounted solar cells may not provide enough power for the on-board instruments. Traditional rigid solar arrays necessitate larger satellite volumes and weights and also require extra apparatus for pointing the spacecraft solar arrays.

The limited surface area of the microsatellites or nanosatellites is the power choke problem where insufficient energy is collected. One potential solution to the power choke problem is the use of a spherical deployable power system having a spherical outer surface covered with solar cells offering a high collection with low weight and low stowage volume, while eliminating the need for a solar array pointing mechanism. For powering spacecraft, the collection of solar energy requires the exposure of solar cells to sunlight. The thin film solar cell must be capable of maintaining thermal equilibrium by radiating all thermal energy absorbed while operating in a space vacuum environment. Solar cells absorb nearly 90% of the incident sunlight and convert a small portion, for example 5–20%, of that energy to electricity. To maintain thermal equilibrium, the solar array has thermal properties that allow rejection of the total solar input as thermal radiation. The solar array design uses materials that have the appropriate thermal radiation coefficients to allow thermal equilibrium to be reached at a temperature that is optimum for the efficient operation of the solar cells.

The power sphere is a curved electrical power system. However, modern solar cell panels are typically fabricated using a plurality of rigid solar cell panels unsuitable for flexible forming about curved surfaces. For thermal radiation of heat absorbed from incident solar radiation and for the collection of energy through solar illumination, typically a rigid solar cell would be bonded using adhesives to a thick transparent cover glass. This same basic fabrication methodology has been transferred to the production of thin film solar arrays by using an adhesive to bond a transparent polymer on the top of the thin film solar cell. The adhesive is subject to damage and failure through thermal cycling, radiation and solar ultra violet illumination.

Thin film solar cells have been deposited on kapton polyimide forming an integral flexible thin film solar cell that is then bonded between opposing sheets of polymer (i.e. Tefzel) having the required transparent and thermal emissive properties. These thin film solar cells have been used in terrestrial application but suffer from the use of bonding adhesive completely covering the surfaces of the sheet polymer tefzel used for terrestrial environmental protection.

Thin film solar cells could be bonded using the adhesive to flexible thin film circuit boards. Traditional flexible printed circuit boards are fabricated by laying copper circuitry down on both sides of a flexible substrate and then using adhesive to bond subsequent pairs of circuits or alternating a polymer material layer with the copper circuitry and laminating each pair of layers to bond the pairs. The multiple layers of polymer material bonded together with an adhesive with each layer having a different coefficient of thermal expansion would induce differential mechanical stress between the various layers at different operating temperatures. This arrangement is unsuitable for flexible thin film solar arrays because the adhesive layer may be damaged by temperatures required for deposition of the thin film solar cell on the flexible circuit, because the adhesive layer adds weight and might result in relatively thick films, and because the multiple layers of polymer material film and adhesive would result in a film with differences in coefficients of thermal expansion that would induce different mechanical stresses in the composite material at different temperatures during solar illumination cycles. The multiple layers of polymer material and adhesive layers significantly increases the mass and complexity of the power sphere. For commercial terrestrial uses, this problem of alternate layers of adhesive and polymer might be manageable, but for the space environment this delaminating problem is much greater due to the wide temperature extremes that the power sphere will be exposed to during different parts of each orbit. In addition, the total number of thermal cycles that a low earth orbiting satellite experiences on a daily basis is far greater than one would expect for most terrestrial applications.

The basic architecture of the power management and control system for the power sphere requires regulation of each individual solar cell mounted on the surface of the sphere. This power management and control system has not been integrated with flexible thin film solar cells suitable for flexible forming about a small curved surface such as the exterior of a nanosatellite or microsatellite. These and other disadvantages are solved or reduced using the invention.

SUMMARY OF THE INVENTION

An object of the invention is to provide a flexible space qualified thin film solar cell having a thermal emissive layer for heat rejection.

Another object of the invention is to provide a flexible circuit board having multiple layers of deposited thin films adhered together without the use of bonding adhesives.

Yet another object of the invention is to provide a flexible solar cell power module having a top thermal emissive layer and a bottom flexible circuit board integrally fabricated using thin film processes.

The present inventions are directed to a flexible thin film circuit, such as thin film solar cells, and methods of manufacturing the same. In order to reduce mass of the microsatellite, an integrated thin film solar power module is used. The thin film solar cell with associated interconnects and power processing electronics for regulating the solar generated electricity are integrated into the polymer material substrate on which the thin film solar cell is fabricated. The thin film solar cell is fabricated on a flexible printed circuit board. The flexible printed circuit board is made of a polymer material with the required copper traces for the electronic circuit embedded within the thickness of the polymer film.

In order to simplify the wiring harness of a power sphere, a preferred location for the required power regulation electronics required for each solar cell is on the backside of the substrate for the solar cell. The circuit traces for the power processing electronics are not bonded to flexible thin film solar cells, but are integrated into thin film layer by deposition of circuit traces within thin films forming a thin film circuit board, which is also the substrate for the thin film solar cell. The integrated thin film assembly can be used in the power sphere with reduced mass and wiring. The flexible thin film solar power module is connected to a simple two wire bus eliminating the need to run individual wires from each solar cell to a central grouping of power processing electronics.

The integrated multiple layer flexible thin films in an integrated circuit board eliminates the need for multiple adhesive layers between multiple polymer layers thereby eliminating large variants in thermal coefficient of expansion and difference in thermal emissivity. The fabrication of multiple thin films upon one another without the use of adhesives enables the manufacture of a flex circuit board that has only two components, which are the polymer material and the embedded metal for the circuit traces. This improved flex circuit board can be fabricated with extremely thin layers of polymer material on which the metal circuit traces are deposited between deposition of subsequent layers of polymer material. The resultant flexible circuit board can be utilized as the substrate for depositing the thin film solar cell. Another top thin film layer of clear polymer can be deposited on top of the solar cell thereby providing proper thermal emissivity without the use of an adhesive. Hence, the solar power module comprising a top thermal emissive layer, center thin film solar cell and the bottom flex circuit is an integrated flexible thin film solar cell power module. Additionally, the integrated flexible solar cell power module could be further enhanced with mounted discrete power electronic components on the backside of the flexible circuit board assembly for providing necessary electronic processing control. These and other advantages will become more apparent from the following detailed description of the preferred embodiment.

DETAILED DESCRIPTION OF THE PREFERRED EMBODIMENT

Figure 1:
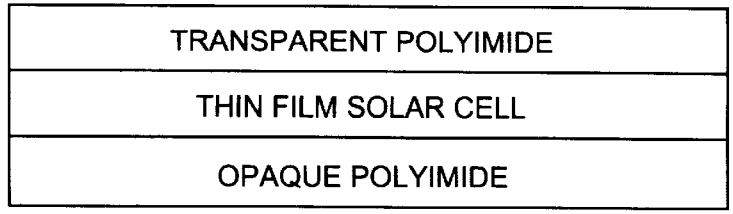
FIG. 1 depicts a thin film solar cell.

An embodiment of the invention is described with reference to the figures using reference designations as shown in the figures. Referring to FIG. 1, a thin film solar cell and a transparent polyimide layer form a flexible thin film solar cell. The transparent polyimide layer is preferably a thermal emissive transparent polyimide layer enabling solar illumination of the solar cell which provides thermal emissivity of heat. In various preferred forms, the flexible thin film solar cell may further comprise an opaque polyimide layer as a covering or interconnection layer. The opaque polyimide layer can be disposed on the thin film solar cell to improve strength or for integrating additional electronic devices, circuits and conduction traces.

The covering layer of polyimide can be deposited using a solvent spin method. Polyimide is dissolved in a solvent, such as Dimethylacetamide in a concentration of 15% weight solids, and spun on the thin film solar cell that is then baked at a temperature of 180 degrees Centigrade, for 12 hours. A cover layer can be as thin as 0.1 microns, but thick layers are more desirable. The cover layer must be at least two Mils thick to obtain the required thermal emissive properties. The thickness of the layer can be grown by applying additional coats of the polyimide in the solvent. The solvent penetrates into the existing layer, and when baked, the solvent evaporates leaving an additional amount of polyimide on the existing layers. As a result, the covering layer is a homogenous uniform layer without any interface transitions between successive layers. In this manner, the thickness of the cover layer can be controlled to a desired thickness.

Figure 2:
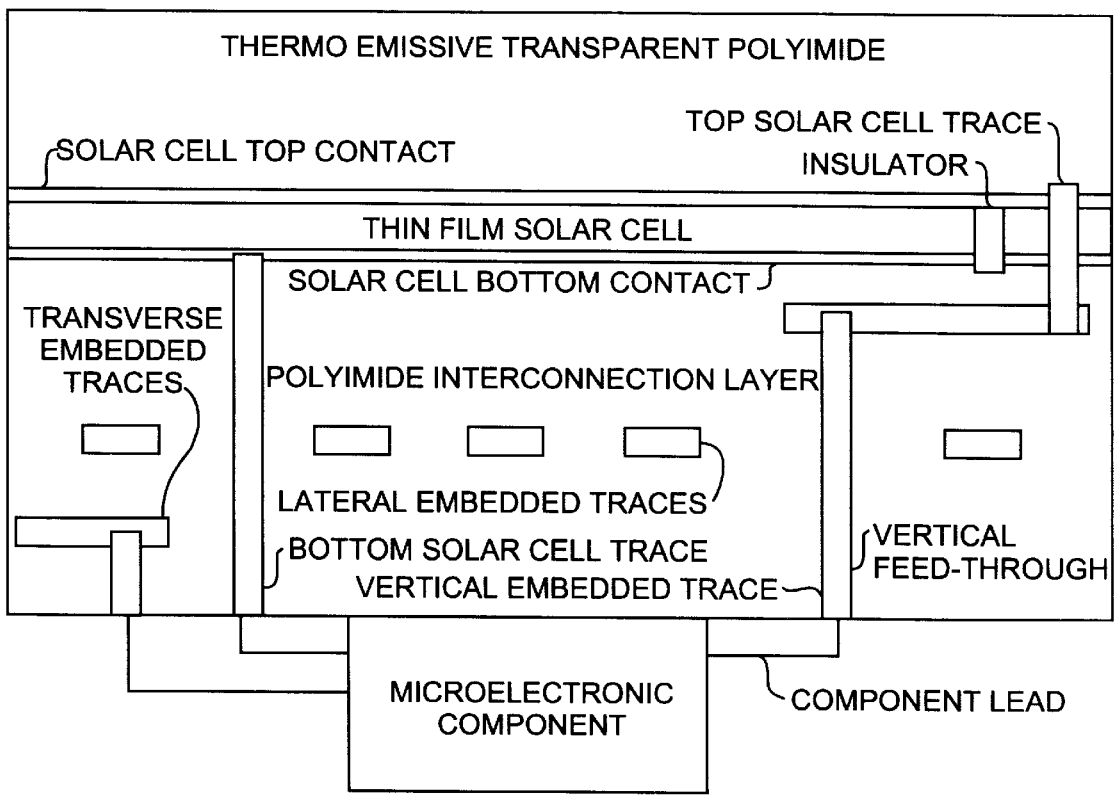
FIG. 2 depicts a thin film solar cell power module with an integrated thin film circuit board.

Referring to FIG. 2, an integrated solar power module includes the thin film solar cell. Thin film solar cell materials typically have low thermal emissivity and thermal emission is necessary for regulating heat. The thin film solar cell is integrated with a thermal emissive transparent polyimide layer functioning as cover glass. The thermal emissive transparent layer may be deposited on the thin film solar cell. The thin film solar cell can function as a substrate for deposition of the polyimide layer that offers thermal emissivity that can be used to reject thermal energy as thermal radiation yet enable solar illumination of the thin film solar cell. A plurality of solar cells can be integrated together as a flexible thin film solar array that can be used in a space vacuum environment where the only method of rejecting thermal energy is through thermal radiation. The addition of a transparent plastic type material with high thermal emissivity such as clear polyimide solves the thermal problem and protects the cell from space radiation. The top thin film clear polyimide is deposited directly on the amorphous silicon solar cell using polymer-manufacturing processes without the use of bonding adhesives.

The thin film solar cell power module further includes a solar cell top contact and a solar cell bottom contact for interconnecting a plurality of solar cells, not shown, to form an array of solar cells. The solar cell power module includes a top contact layer for interconnecting the plurality of solar cells for forming a flexible solar array panel for a solar cell array including the solar array and the covering thermal emissive transparent polyimide layer. An insulator is used for insulating the top and bottom solar cell contact layers for extending a vertical feed through from the top contact layer into the interconnection layer.

A polyimide interconnect layer may be deposited on the backside of the thin film solar cell. In the preferred form, the polyimide interconnection layer functions as a substrate on which is deposited the thin film solar cell as well as the top and bottom contacts and the covering thermal emissive layer. The interconnected layer is built up from a plurality of layers deposited during respective deposition steps between which lateral and traverse embedded interconnection traces can be deposited. The lateral and traverse embedded traces extend horizontally through the polyimide interconnection layer. Vertical traces, including a top solar cell trace, bottom solar cell trace and vertical embedded traces may also be formed in the polyimide interconnection layer. The vertical traces are formed by creating a vertical feed through in the interconnection layer and depositing conducting metal within the feed through. The horizontal and vertical traces can be manufactured to form any arbitrary three-dimensional interconnection matrix within the interconnection layer. The interconnection layer can be any suitable insulating polymer film, but must also be a thermal emissive layer as well for heat rejection. An electronic component, such as power converters used in a solar cell power regulation system, can be deposited or bonded onto the back side of the interconnection layers and then connected to the interconnection matrix using component leads or deposited metal etch runs. Even though the devices may be bonded, the bonded area under the devices is relatively small and segmented. Therefore, differences in thermal expansions at the adhesive layer will not lead to failure during temperature cycling. As such, the interconnection layer and integrated microelectronic component can form any arbitrary flexible interconnection circuit board with and without microelectronic components. The solar cell power module is an integrated device including the thermal emissive covering, the solar cell, interconnection matrix in the interconnection layer and microelectronic power distribution components. A plurality of solar cell power modules formed integrally together would form a complete. solar array power system that is flexible for forming about curved surfaces, such as a power sphere nanosatellite.

Figure 3:
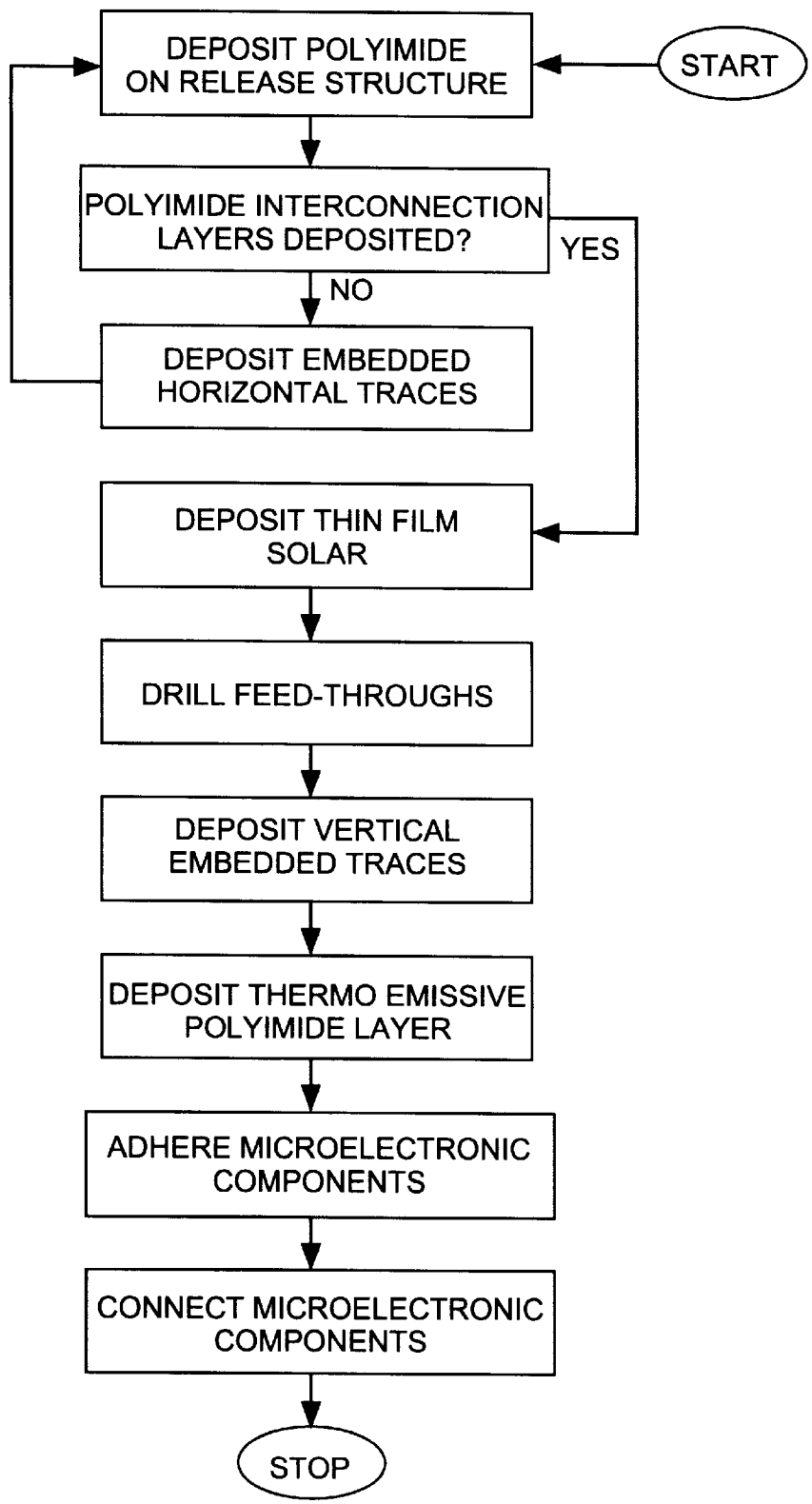
FIG. 3 is a flow diagram of processing steps for manufacturing a thin film solar cell power module.

Referring to all of the Figures, and more particularly to FIG. 3, the solar cell power module can be fabricated using semiconductor and polymer type manufacturing processes in a batch mode or continuous roll-to-roll mode using economy of scale for mass production. The solar cell power module makes use of a substrate interconnection layer that preferably has high thermal emissivity. Thin film solar cell material may be deposited directly on the substrate interconnection layer during fabrication processes. The completed thin film solar cell is covered with the flexible transparent cover that has the required thermal emissivity. The transparent cover material may be deposited on the solar cell by directly depositing the layer of clear polyimide directly on the top layer of the amorphous silicon solar cell. This process eliminates the need for adhesives to bond the transparent cover to the solar cell.

In the preferred form, a release structure, such as a stiff sheet of Teflon, is first used as a substrate on which is deposited the polyimide to form the interconnection layer in repeated applications so as to grow the thickness of the interconnection layer. In between successive depositions of the polyimide of the interconnection layers, interconnection layers having horizontal lateral and traverse metal traces can be deposited for burying the traces within the interconnection layer. A metal, such as copper, is deposited on the polymer material interconnection layer over which another layer of polymer layer is deposited. This process is repeated to fabricate multilayer flexible printed circuit boards. After depositing all of interconnection layers, the release structure is removed with the resulting interconnection layer now functioning as a substrate for thin film solar cell deposition including the deposition of the top and bottom solar cell contacts. In a series of conventional solar cell processing steps, a thin film solar cell is deposited on the flexible printed circuit board. Feed throughs are then preferably drilled, or alternatively etched into the interconnection layer and the embedded vertical traces are deposited into the cavity of the drilled feed through. The vertical traces connect with the horizontal traces and the top and bottom solar cell contacts. Preferably, next the top covering glass thermal emissive polyimide layer is deposited directly on the thin film solar cell including the top solar cell contact layer. The microelectronic device is bonded to the backside of the interconnection layer. Preferably, the mounting of discrete electronic components on the backside or depositing semiconductor devices on the backside occurs after depositing the thin film solar cell. Connection leads are bonded to the microelectronics device and interconnection layer for electronic coupling the device to the solar cell. As such, an integrated flexible thin film solar cell power module is formed comprising a thermal emissive coating directly deposited upon the thin film solar cell without the use of bonding adhesive, and the interconnection layer and microelectronic device form a flexible circuit board. The board and coated thin film solar cell can be extended during fabrication to form a flexible solar cell array power system.

The thin film solar cell can be made by differing processes. For example, the thin film solar cell can be deposited directly on a sheet of rolled kapton polyimide with the cover layer then deposited on the thin film solar cell. The kapton rolls are available in 0.08 to 2.0 Mils in thickness. While kapton polyimide may be used, other polymers with transparent and thermal emissive properties could be used as either the covering layer or the interconnection layer.

The integrated solar cell module can be made by differing processes as well. For example, the thin film solar cell can be deposited on a 0.5 to 2 mil thick polyimide substrate and then the interconnection layer can be deposited on a back side of the polyimide substrate of the thin film solar cell. Feed through holes can be made in the interconnection layer for forming the vertical traces and for bonding of the microelectronic devices and bonding wire interconnections. Finally a transparent thermal emissive covering layer is then deposited on the thin film solar cell.

As may now be apparent, the flexible integrated solar power module consists of a flexible printed circuit board, that is, the interconnection layer, a flexible thin film solar cell with a flexible top thermal emissive coating formed without the use of bonding adhesives, and associated power regulating electronics that may be bonded or deposited on or within the interconnection layer. The flexible printed circuit board being used as the substrate for a thin film solar cell deposition on one side, and used for mounting electronic circuit components on the other side. In the preferred form, both the top clear covering layer and the bottom interconnection layer are both made of clear polyimide offering front and back heat rejection. The clear polyimide interconnection substrate offers additional heat rejection. The thermal design for a typical solar power sphere may require a thermal emissivity of approximately 0.8 for both the front and back surfaces of the flexible thin film solar cell.

The flexible thin film solar cell, the flexible thin film solar cell power module, the flexible thin film solar array power system, and the flexible circuit board can be used for both terrestrial commercial use and for use in a space vacuum environment. The flexible thin film solar cell power module or solar array power system can be used, for example, for collecting power in a solar power sphere concept as the electric power system for microsatellites and nanosatellites. This improved power sphere with flexible solar array panels is well suited for integration in of microsatellites and nanosatellites in low earth orbits that require the collection of sufficient power for onboard instruments within a low weight and low volume spacecraft. Because the overall surface area of a microsatellite or nanosatellite is small, body mounted flexible solar cells are capable of providing sufficient power without a pointing apparatus as the solar illumination of the power sphere is constant regardless of the attitude of the solar power sphere. Hence, the solar power sphere with the surface mounted flexible thin film solar power modules would offer a high collection area relative to the low weight and low stowage volume of the microsatellite while eliminating the need for a solar array attitude pointing mechanism. The spherical shape collects the same amount of solar energy for any angular position of the sun relative to the satellite. When in sunlight, the constant energy absorption provides stable electrical power generation and a stable, moderate thermal environment for the enclosed spacecraft payload, independent of satellite attitude. During eclipse periods, the sphere also acts as a thermal radiation barrier, minimizing the temperature drop of the enclosed satellite payload during the eclipse. The solar power sphere converts sunlight into direct current electricity through the use of the thin film flexible solar cell power module mounted on the deployable spherical structure.

The present inventions include the thin film solar cell with the thermal emissive coating directly deposited onto the thin film solar cell. The inventions also include the interconnection printed circuit board, as well as an integrated solar power module that can be extended into a flexible solar array power system. The solar power sphere thus can utilize a deployable solar cell array power system formed to the exterior curve surface offering power collection and thermal regulation of the microsatellite or nanosatellite. Those skilled in the art can make enhancements, improvements, and modifications to the invention, and these enhancements, improvements, and modifications may nonetheless fall within the spirit and scope of the following claims.

What is claimed is:

1. A method of manufacturing a thin film printed circuit board for interconnecting electronic devices, the method comprising the steps of, depositing multiple layers of polymer on a release structure, depositing one or more horizontal metal traces between the multiple layers of the polymer, forming vertical traces through vertical feed through in the layers of the polymer, and releasing the multiple layers from the release structure, the multiple layers of polymers and the horizontal traces and vertical traces forming the thin film printed circuit board.

2. The method of claim 1 further comprising the step of, depositing a thin film device on a first side of the thin film printed circuit board, the thin film device being connected to the vertical traces.

3. The method of claim 1 further comprising the step of, depositing a plurality of thin film devices on a first side of the thin film printed circuit board, the thin film devices being interconnected to the vertical traces.

4. The method of claim 1 further comprising the steps of, depositing a thin film solar cell on a first side of the thin film printed circuit board, the thin film device being connected to the vertical traces, and depositing a thermal emissive covering layer upon the thin film solar cell, the thermal emissive covering layer for communicating solar illumination of the thin film solar cell and for rejecting heat.

5. The method of claim 4 further comprising the step of, bonding a converter circuit on a second side of the printed circuit board, and connecting the converter circuit to the vertical traces of the printed circuit board, the printed circuit board forming a power module.

6. The method of claim 5 wherein the multiple layers are made of polyimide for further heat rejection.

7. The method of claim 1, depositing a plurality of thin film solar cells on a first side of the thin film printed circuit board, the thin film devices being interconnected to the vertical traces, and depositing a thermal emissive covering layer upon the plurality of thin film solar cells, the thermal emissive covering layer for communicating solar illumination of the thin film solar cell and for rejecting heat, and bonding a converter circuit on a second side of the printed circuit board for forming a power module system.

8. The method of claim 5 further comprising the step of, forming the printed circuit board about a curved surface.

* * * * *